United States Patent [19]

Evans

[11] 4,368,541

[45] Jan. 11, 1983

[54] MULTIPLEXING ARRANGEMENT FOR A PLURALITY OF VOLTAGE CONTROLLED FILTERS

[76] Inventor: Robert M. Evans, Fox Hunt Rd., Ringoes, N.J. 08551

[21] Appl. No.: 164,684

[22] Filed: Jun. 30, 1980

[51] Int. Cl.³ .............................. H04B 1/16; H03J 5/24
[52] U.S. Cl. ..................................... 455/186; 455/187
[58] Field of Search ............... 455/186, 178, 179, 182, 455/173, 183, 175, 185, 187, 191, 195, 197, 340; 358/191.1, 193.1, 195.1; 334/14, 15

[56] References Cited

U.S. PATENT DOCUMENTS

| | | | |
|---|---|---|---|
| 3,550,010 | 12/1970 | Byers . | |
| 3,652,960 | 3/1972 | Sakamoto | 455/187 |
| 3,696,302 | 10/1972 | Gossard . | |
| 3,778,736 | 12/1973 | Sakamoto | 455/187 |
| 3,852,670 | 12/1974 | Ma . | |
| 3,924,191 | 12/1975 | Collins | 455/161 |
| 4,011,515 | 3/1977 | Hanson | 455/187 |
| 4,123,717 | 10/1978 | Yiu | 455/186 |
| 4,153,887 | 5/1979 | Poppa . | |
| 4,209,751 | 6/1980 | Sakamoto | 455/186 |

FOREIGN PATENT DOCUMENTS

| | | | |
|---|---|---|---|
| 2109107 | 2/1971 | Fed. Rep. of Germany | 455/307 |
| 2003347 | of 0000 | United Kingdom . | |

OTHER PUBLICATIONS

Digital Logic Handbook, C-105, published in 1967 by Digital Equipment Corp., p. 284.
"A Systems Approach to Low-Cost Electronic Tuning Address" by B. Howell, J. Reid, F. Zlotnick, IEEE Transactions on Consumer Electronics, vol. CE-24, No. 3, Aug. 1978, pp. 408-418.

Primary Examiner—Tommy P. Chin
Attorney, Agent, or Firm—E. M. Whitacre; P. J. Rasmussen; P. M. Emanuel

[57] ABSTRACT

A multiplexing arrangement enables a plurality of control voltages for controlling respective ones of a plurality of varactor controlled tunable filters, employed, e.g., prior to the tuner of a television receiver to reject undesired signals, to be generated by a single digital to analog (D/A) converter. A controller, which may, e.g., comprise a microcomputer, sequentially applies digital control words to the D/A converter and substantially synchronously causes the resultant control voltages generated by the D/A converter to be applied, through respective switches to the tunable filters. The control voltages are applied to capacitors connected to d.c. control lines for the tunable filters. The high impedance of the varactor diodes included in the filters enables the capacitors to store respective control voltages for relatively long intervals before the control voltages need to be refreshed. This enables a large number of tunable filters to be controlled by a single D/A converter.

14 Claims, 7 Drawing Figures

MULTIPLEXING ARRANGEMENT FOR A PLURALITY OF VOLTAGE CONTROLLED FILTERS

The present invention pertains to arrangements employing a plurality of tunable filters having amplitude versus frequency responses determined by the magnitudes of respective control signals.

Tunable filters responsive to the magnitude of a tuning voltage are employed in tuners for radio and television receivers to select one RF carrier from a plurality of received RF carriers and for generating a local oscillator signal having the appropriate frequency for heterodyning the selected RF carrier to produce an IF signal. In addition, as is discussed in copending U.S. patent application, Ser. No. 154,834, filed May 30, 1980, entitled "Pre-Tuner Tracking Traps Responsive To A Tuning Voltage," filed in the name of G. E. Theriault, tunable traps may be employed prior to the tuner to attenuate undesired signals at frequencies tracking respective desired RF carriers at predetermined negative and positive offsets. In one disclosed arrangement, the frequency offsets of the traps are fixed with respect to respective desired carriers by selecting the fixed inductors and capacitors of the traps thereby enabling a single control voltage to control the tracking of each trap. In another disclosed arrangement the frequency offsets of the traps are controlled by respective different control voltages. As a result, individual control circuits are utilized to generate the respective control voltages for the traps.

The present invention is directed at avoiding the need for individual control circuits for each of a plurality of tunable filters which may be employed in a receiver. Specifically, in accordance with the present invention, a receiver includes at least first and second tunable filters having amplitude versus frequency responses controlled in response to the magnitudes of respective first and second control signals, a single control circuit for generating the first and second control voltages at first and second respective times and a multiplexing arrangement for selectively applying the first and second control voltages to the first and second tunable filters at the first and second times, respectively. Desirably the tunable filters each include a voltage controlled capacitance, more commonly known as a varactor diode, as a frequency control element. Because varactor diodes are reverse biased, they exhibit a high enough impedance to allow the time interval between the first and second time to be relatively long, e.g., in the order of minutes. This enables a large number of tunable filters to be controlled by a single control circuit.

The following detailed description describes an embodiment of the present invention with reference to the accompanying drawing in which.

Figure 1:
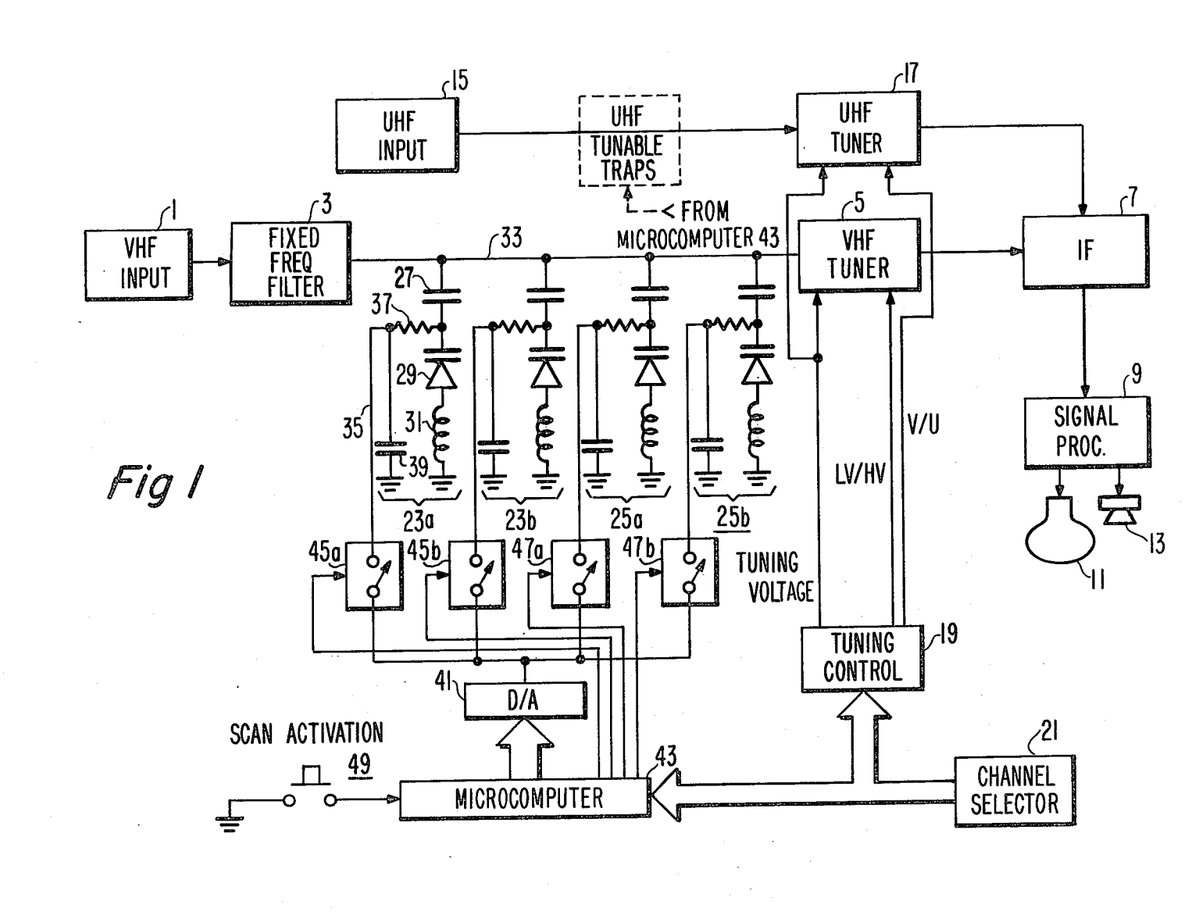
FIG. 1 is a schematic, partly in block form, of a television receiver employing an embodiment of the present invention comprising a control arrangement for controlling a number of tunable traps connected prior to the tuner.

In FIG. 1, a television receiver includes a VHF input 1 for receiving television RF carriers in the VHF range provided by an antenna or cable system. The received RF signals are filtered by an input filter to remove undesired signals at fixed frequencies or in fixed bands of frequency, such as, e.g., CB (Citizens Band) RF carriers. The filtered RF signals are applied to a VHF tuner 5 which selects a particular one of the received RF carriers associated with a selected VHF channel and heterodynes it with an internally generated local oscillator signal having an appropriate frequency corresponding to the selected channel to produce an IF signal. The IF signal is filtered and amplified by an IF processing unit 7. Picture, color, synchronization and sound components of the IF signal are processed by a signal processing unit 9 to control the generation of an image by picture tube 11 and audio response by speaker 13.

The receiver also includes a UHF input 15 for receiving television RF carriers in the UHF range and a UHF tuner 17 for selecting and heterodyning a particular RF carrier associated with a selected UHF channel to produce a RF signal. VHF tuner 5 and UHF tuner 17 are selectively activated in response to respective levels, e.g., +18 and 0 volts d.c., of a V/U band selection signal.

VHF tuner 5 and UHF tuner 17 each include various tunable filters (not shown) for selecting a desired one of the RF carriers and controlling the frequency on a local oscillator (not shown) in accordance with the selected channel. These tunable filters typically each include a parallel tuned circuit comprising an inductor and a voltage variable capacitance or varactor diode connected in parallel combination. A tuning voltage is applied to the varactor diode to reverse bias it. Under these conditions, the varactor diode exhibits a capacitive reactance having a value determined by the magnitude of the tuning voltage. The magnitude of the tuning voltage is varied to tune the tuned circuits to the desired frequency.

In the United States, the VHF range includes a low VHF band for channels 2 through 6 between 55.25 and 83.25 MHz (in terms of picture carrier frequencies in the RF range) and a high VHF band for channels 7 through 13 between 175.25 and 211.25 MHz. Since most commercially available varactor diodes are incapable of tuning a tuned circuit including a fixed value inductor over the entire VHF range, the tuned circuits of VHF tuner 5 includes a switching arrangement for selectively connecting different combinations of inductors for each of the low and high VHF band in response to different levels, e.g., +18 and 0 volts d.c., of a LV/HV signal band selection. U.S. patent application, Ser. No. 119,991, entitled "Controlled Local Oscillator With Apparatus For Extending Its Frequency Range," filed in the name of George William Carter on Feb. 8, 1980, and assigned, like the present application, to RCA Corporation, which application is hereby incorporated by reference, may be referred to for its disclosure of parallel tuned circuits including varactor diodes and switching arrangements for selecting different combinations of inductors.

The V/U and the VL/VH band selection signals and tuning voltage are generated by a tuning control unit 19 in response to binary signals representing the channel number of the selected channel generated by a channel selector 21. U.S. Pat. No. 4,031,549, entitled "Television Tuning System With Provisions For Receiving RF Carriers at Nonstandard Frequencies," issued in the name of Robert Morgan Rast et al. on June 21, 1977, and assigned, like the present application, to RCA Corporation, which patent is hereby incorporated by reference, may be referred to for its disclosure of a phase locked loop tuning control system for generating a tuning voltage and band selection signals.

Four tunable traps 23a, 23b, 25a and 25b are connected between fixed frequency filter 3 and VHF tuner 5. A first pair of traps 23a and 23b are intended to attenuate undesired signals at respective negative and positive frequency offsets from a desired RF carrier selected by VHF tuner 5 for channels in the low VHF band. A second pair of traps 25a and 25b are intended to attenuate undesired signals at respective negative and positive frequency offsets from a desired RF carrier selected by VHF tuner 5 for channels in the high VHF band.

A pair of traps having attenuation frequencies offset negatively and positively from the desired frequency, rather than a single trap, are utilized, as is disclosed in the aforementioned copending patent application filed in the name of Theriault, to inhibit the formation of uncompensated residual resonances which tend to detune the tuned circuits of VHF tuner 5. It is desirable for this purpose, to select the magnitudes of the frequency offsets to be substantially equal. In addition, when the magnitudes of the negative and positive frequency offsets are substantially equal, a maximum amplitude response will beneficially be produced at the desired frequency.

Tunable traps 23a, 23b, 25a and 25b are all constructed in substantially the same manner. Therefore, only the construction of trap 23a will be described in detail. Tunable trap 23a comprises a series-tuned circuit including a d.c. blocking capacitor 27, a varactor diode 29 and an inductor 31 connected in series between a conductor 33, which conductor connects the output of fixed frequency filter 3 to the input VHF tuner 5, and a signal ground point. Varactor diode 29 is poled to be reverse biased by the application of a positive control voltage to its cathode through a conductor 35 and an isolation resistor 37. A filter capacitor 39, connected between conductor 35 and a signal ground point, attenuates undesired a.c. components which may undesirably be superimposed on the control voltage.

In the present arrangement, individual control voltages for respective tunable traps 23a, 23b, 25a and 25b are generated by a single digital-to-analog (D/A) converter 41. A microcomputer 43 applies digital control words comprising groups of coded binary signals representing the control voltage for each of tunable traps 23a, 23b, 25a and 25b to D/A converter 41 at predetermined time intervals in a predetermined time sequence and substantially synchronously generates switch control signals for closing the corresponding ones of normally opened switches 45a, 45b, 47a and 47b to apply the control voltages generated by D/A converter 41 to respective ones of tunable traps 23a, 23b, 25a and 25b. Thus the control voltages are not continuously applied to tunable traps 23a, 23b, 25a and 25b but only applied at the predetermined time intervals. During the intervals in which ones of switches 45a, 45b, 47a and 47b are opened, the filter capacitors (39 of tunable traps 23a and the corresponding filter capacitors of traps 23b, 25a and 25b) store the respective control voltages. It has been found that due to the relatively high d.c. impedances of the reverse biased varactor diodes within tunable traps 23a, 23b, 25a and 25b, the levels of the respective control voltages are readily maintained for relatively long intervals, e.g., in the order of minutes, without amplitude reductions corresponding to significant attenuation frequency shifts. Thus, by multiplexing the generation and application of the control voltages several tunable traps can be controlled by a single D/A converter.

Two pairs of tunable traps are used to cover the entire VHF range because of the tuning range limitations of a single varactor diode in combination with a fixed inductor configuration earlier discussed with reference to the tunable circuits of VHF tuner 5. While it is possible to use a single pair of tunable traps each including a switching diode for selecting different inductor configurations depending on whether a channel in the low VHF or high VHF band is selected, as earlier discussed with reference to the tunable circuits of VHF tuner 5, the arrangement shown in FIG. 1 is more desirable. This is so for the following reasons. In the former type of arrangement, relatively high level currents (e.g., in the order of 10 milliamperes d.c.) are required to keep a switching diode for selecting the inductor configuration conductive. Accordingly, relatively large value capacitors would be required to supply sufficient current to keep associated switching diodes conductive during intervals in which the switching diode control signals are not applied to the switching diodes. As a result, such inductor switching arrangements employing switch diodes are not well suited to multiplexing operations. On the other hand, in the present arrangement, since each of tunable traps 23a, 23b, 25a and 25b employ reverse biased varactor diodes which do not draw high level currents due to their high impedances, low value capacitors may be employed to keep the capacitance value of the varactor diodes substantially constant for relatively long intervals in which the control signals are not applied to the varactor diodes.

Figure 2A:
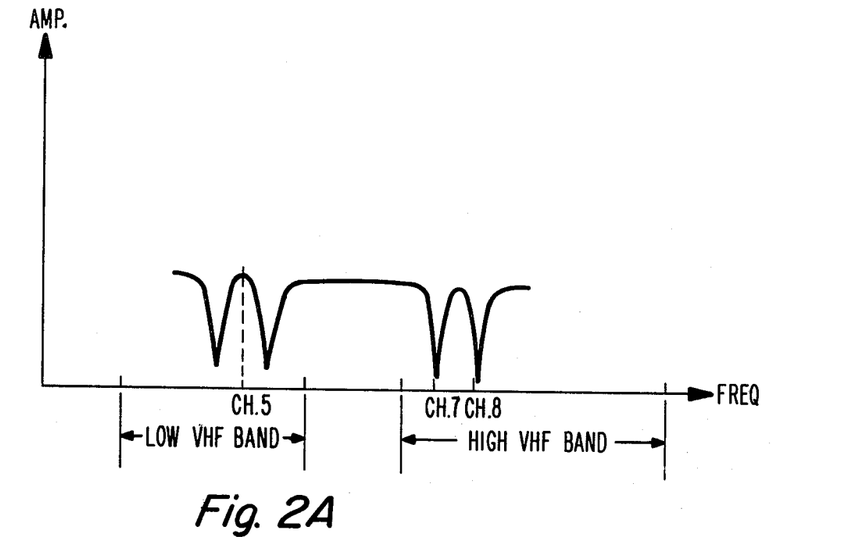
FIGS. 2A and 2B are graphic representations of the amplitude versus frequency response produced by the tunable traps shown in FIG. 1.
Figure 2B:
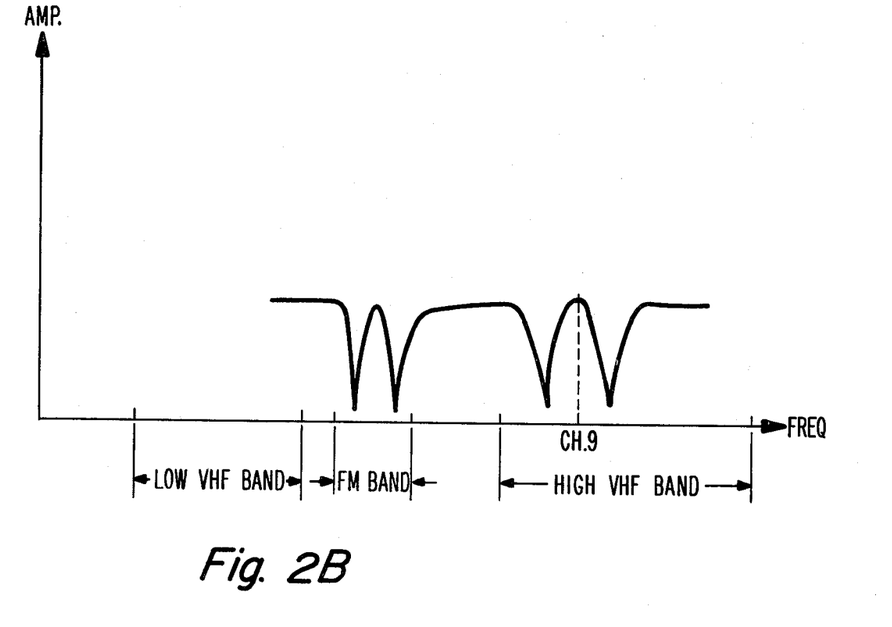

In addition to the aforementioned reason of avoiding relatively high level band switching voltages needed when only a single pair of tunable traps is used, the present arrangement is desirable since it allows two pairs of traps to be utilized simultaneously. Thus, e.g., when a channel in the low VHF band is selected and tunable traps 23a and 23b are controlled to attenuate signals at respective negative and positive frequency offsets from the desired frequency, tunable traps 25a and 25b may be controlled to attenuate signals in or near the high VHF band which can undesirably affect reception of the desired low VHF carrier. For such purpose, e.g., as is graphically illustrated in FIG. 2A, traps 25a and 25b may be controlled to attenuate the RF carriers for the channels in the high VHF band nearest the low VHF band, e.g., channels 7 and 8 in the United States. Similarly, when a channel in the high VHF band is selected and tunable traps 25a and 25b are controlled to attenuate signals at respective negative and positive frequency offsets from the desired frequency, tunable traps 23a and 23b may be controlled to attenuate signals in or near the low VHF band which can undesirably affect reception of the desired high VHF carrier. For such purpose, e.g., as is graphically illustrated in FIG. 2B, traps 23a and 23b may be set to attenuate signal frequencies in the FM band, e.g., in the United States between 88 and 108 MHz.

A manually operable scan activation switch 49 is provided by which a scanning sequence may be controlled to sequentially change the negative and positive frequency offsets of the respective tunable traps associated with the band of the selected channel to optimize the rejection of undesired signals. When a new channel is selected the frequency offsets of the tunable traps associated with the band of the selected channel are controlled by microcomputer 43 to be at initial values. Suitable initial values for the frequency offsets are ±12 MHz. These initial values correspond approximately to the frequency difference between two channels and is appropriate since, in a particular broadcast location, channels in the VHF bands are often assigned to be one channel apart. As a result, the initial values of the frequency offsets causes the attenuation of signals associated with the nearest VHF channel to the selected channel.

When scan activation switch 49 is depressed, a logic level, shown as ground potential, is applied to microcomputer 43. In response, the control voltages for the tunable traps associated with the band of the selected channel are sequentially modified at a predetermined rate so that the attenuation frequencies are moved closer to the desired frequency by predetermined increments, e.g., 3 MHz steps. The predetermined rate is selected slow enough, e.g., between 2 and 4 seconds per step, to allow a viewer to evaluate the resultant image at each step. At predetermined limits, ±3 MHz from the desired frequency, the scanning direction is automatically reversed. The attenuation frequencies continue to be incrementally changed until scan activation switch 49 is released.

Figure 3:
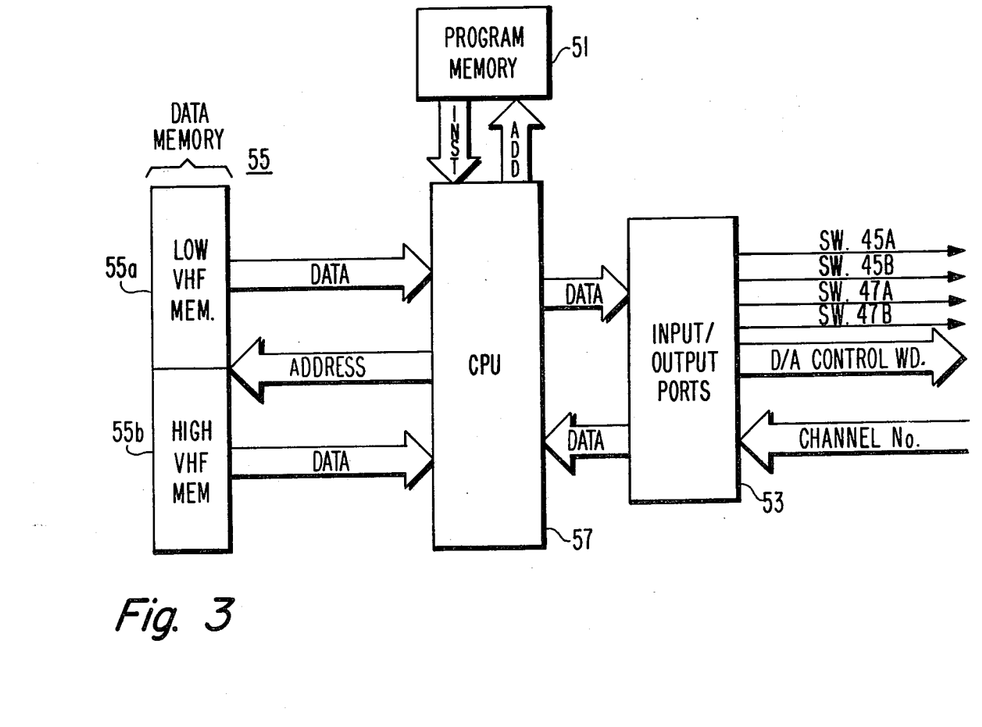
FIG. 3 is a schematic in block form, of a portion of the control arrangement shown in FIG. 1.

Microcomputer 43 may comprise any one of a number of commercially available integrated circuits such as the MK 3870 available from Mostek Corporation. With reference to FIG. 3, microcomputer 43 includes: an addressable memory 51 for storing operating instructions, commonly referred to as the "program," in form of digital words; input and output ports 53 for receiving and transmitting data, also in digital form from and to external devices; and addressable data memory 55 for storing received and processed data; and a central processing unit or CPU 57 for processing data in accordance with the stored program. CPU 57 operates in accordance with the stored instructions to arithmetically and otherwise modify input data it receives from input and output ports 53 and data memory 55 to make decisions based on the data to generate output data. Typically, program memory 51 is a read only memory (ROM) in which the program is permanently stored, e.g., by the addition or removal of connections in a matrix comprising the memory. Typically, data memory 55 is a random access memory (RAM) in which the data may be electrically altered. Microprocessors, differing from microcomputers in that the former typically include only the CPU and input and output parts without a memory, may also be used, in combination with external program and data memories, in place of microcomputer 43. The CD 1802 is a suitable integrated circuit microprocessor commercially available from RCA Corporation.

The control words stored in data memory 55 represent the tuning voltage for the desired frequency to which VHF tuner 5 is stored. The control words are modified, as described below in more detail by adding and subtracting an offset data word corresponding to the magnitude of a predetermined frequency offset to form modified control words representing the control voltages for controlling the tunable traps associated with the band in which the selected channel is in.

Figure 4A:
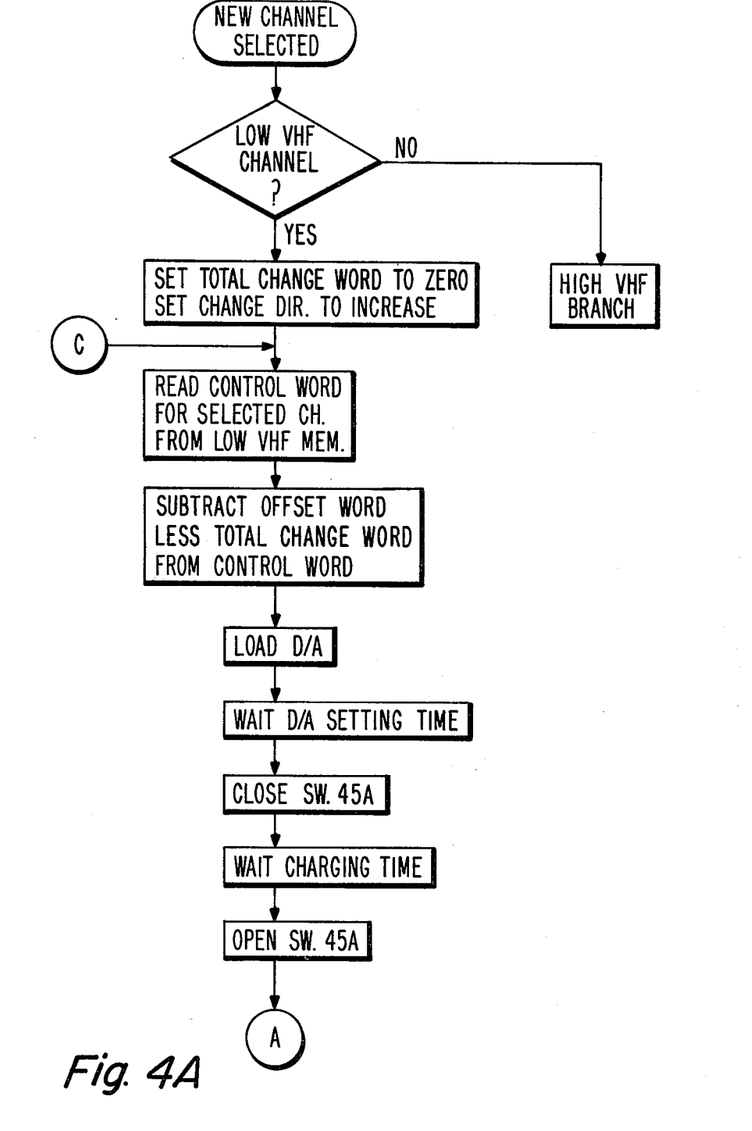
FIGS. 4A, 4B and 4C are flow charts graphically illustrating the operation of the control arrangement shown in FIG. 1.
Figure 4B:
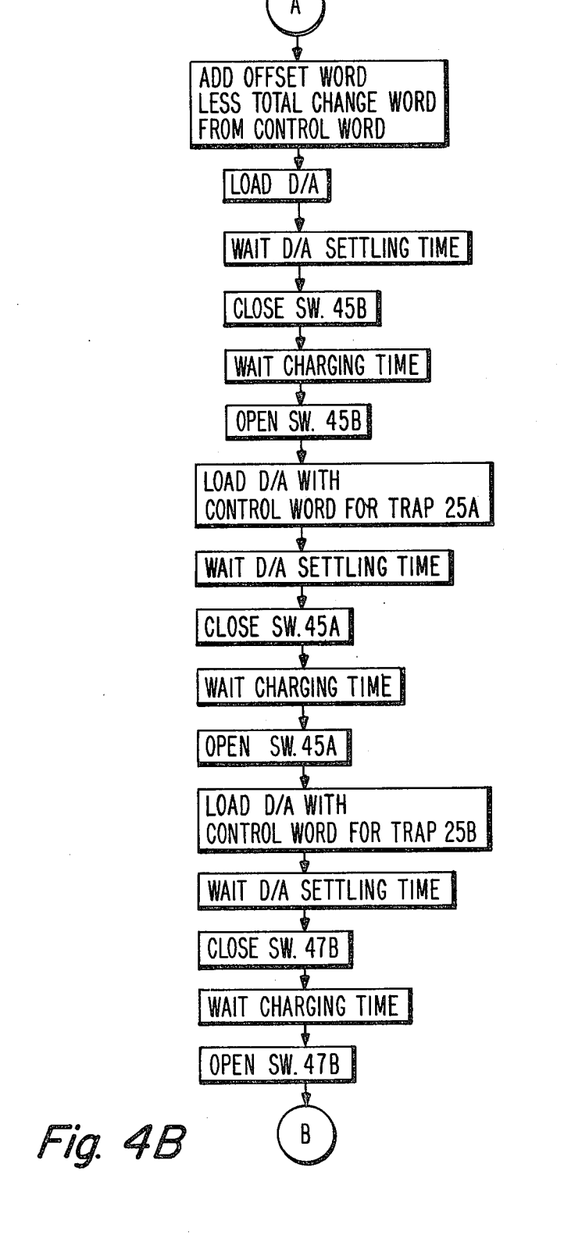
Figure 4C:
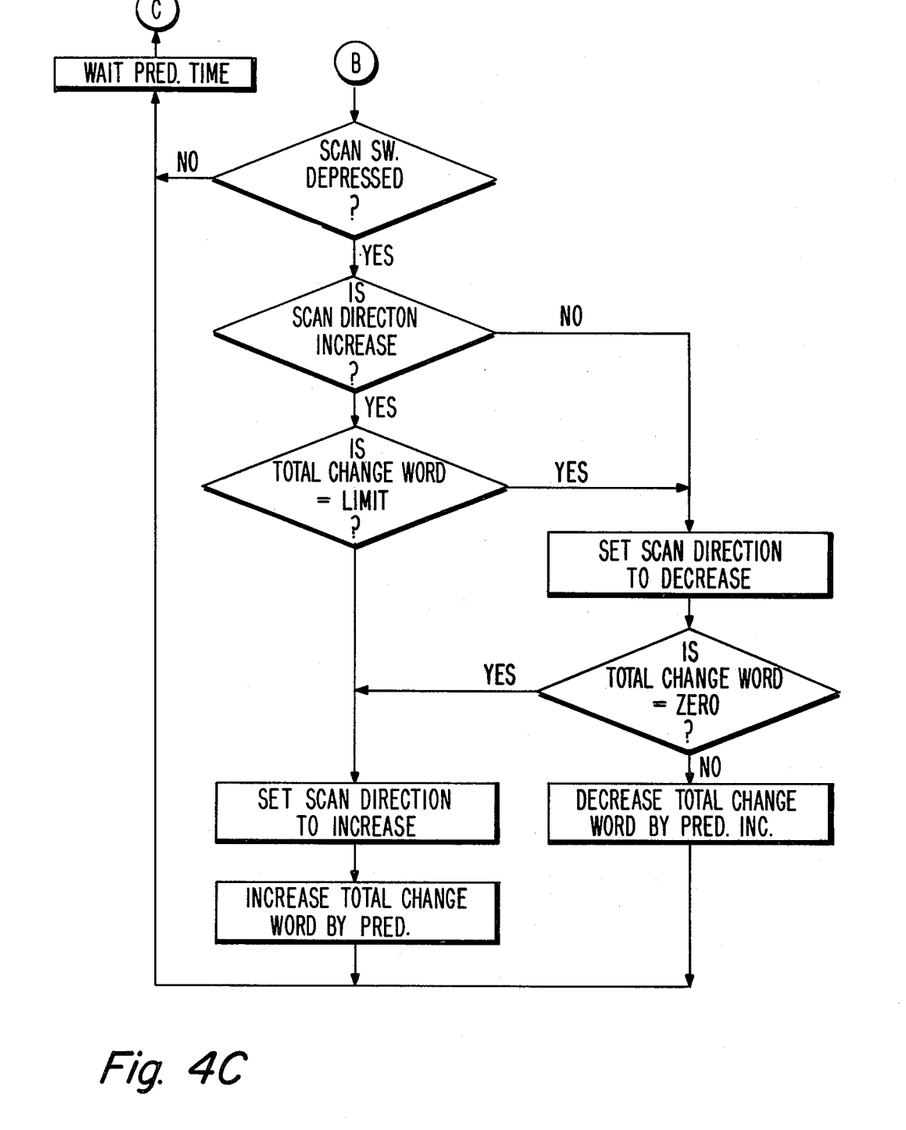

FIGS. 4A, 4B and 4C are flow charts representing the sequential generation and application of the control voltages to tunable traps 23a, 23b, 25a and 25b under the control of microprocessor 43. In the following description, it will be assumed that a channel in the low VHF band has been selected. In addition, it will be assumed that the control voltages are generated and applied to tunable traps 23a, 23b, 25a and 25b in sequence in the order named.

With specific reference to FIGS. 4A and 4B, when binary signals representing a newly selected channel in the low VHF band are applied to CPU 57, after a scanning initialization process to be described below, the corresponding memory location of low VHF memory section 55a is addressed and the control words stored in it are read. To form the control voltage for tunable trap 23a, an offset data word corresponding to a frequency offset in the low VHF range is subtracted from the control word. It will be noted from the flow chart of FIG. 4A, that the data word corresponding to the offset is modified by an amount identified as "TOTAL CHANGE." The latter factor is associated with the scanning operation to be described later and for now can be assumed to represent zero. The result of the subtraction is loaded into D/A converter 41.

After a suitable delay selected to allow D/A converter 41 to accurately convert the result of the subtraction into the corresponding analog voltage, CPU 57 generates a signal which causes switch 45a to close thereby applying the control voltage generated by D/A converter 41 to tunable trap 23a. After a delay to allow filter capacitor 39 of tunable trap 23a to charge, switch 45a is opened. Desirably the charging time will be much shorter than the discharging time. This is accomplished by ensuring that D/A converter has a low output impedance.

Thereafter, the control word read from data memory 55 when the new channel was selected is modified by adding the offset data word to it. The results are applied to D/A converter 41 to generate the control voltage for tunable trap 23b. After the settling time delay for D/A converter 41, switch 45b is closed to charge the filter capacitor of trap 23b and then opened.

As earlier noted, tunable traps 25a and 25b associated with the high VHF band are set to attenuate signals at the same respective frequencies, e.g., those corresponding to channels 7 and 8, for each of the low VHF channels. Accordingly, the control words for tunable traps 25a and 23b need not be stored in data memory 53 and they may be stored in program memory 49 as one of the instruction words. The control voltages for tunable traps 25a and 25b are sequentially generated and applied in a similar manner to the sequential generation and application of the control voltages for tunable traps 23a and 23b, as indicated in FIG. 4B.

With regards to the scanning operation, when a new channel is selected (see FIG. 4A) a data word representative of the total change from the initial frequency offset is set to correspond to a zero change and stored in a convenient temporary register in CPU 57. Additionally, another temporary register, which may comprise a single flip-flop, for storing a binary signal representing the direction of change is set to indicate an increasing change. Now with specific reference to FIG. 4C, if the scan button has been depressed, the change direction and the total change registers are examined to determine the direction and magnitude of offset change. Assuming that the scan activation switch has not previously been depressed, the change direction will be increasing and the predetermined limit at which the scanning direction is reversed will not have been reached. Accordingly, the total change data word is increased by a value corresponding to the predetermined increment. Thereafter, during the generation of the control words for tunable traps 23a and 23b, the offset data word is modified by subtracting and adding, respectively, the total change (see FIGS. 4A and 4B). As a result, the negative and positive frequency offsets will be reduced.

The above operation continues until the predetermined limit is reached (see FIG. 4C). At this point, the change direction data word is changed to indicate a decreasing change and the total change data word is successively decreased by the predetermined increment until the total change is again zero. At this point the scan direction is again changed and the total change data is again increased.

After a total change word has been increased or decreased, there is a delay before the offset data word is modified. The dealy establishes the predetermined rate. The sequential generation and application of the control voltages when a channel in the high VHF band is selected, indicated by a block labeled "HIGH VHF BRANCH" in FIG. 4A, is similar to that just described for when a channel in the low VHF band is selected and will not be described in detail.

While the present invention has been described in terms of a specific embodiment, it will be appreciated that modifications are intended to be within the scope of the present invention defined by the claims. These modifications include but are not limited to the ones discussed below.

Although not shown in FIGS. 4A, 4B and 4C, it is possible to store the final values for the control words which have been modified after scan activation swtich 49 is depressed in place of their original values in data memory 53. In addition, while the flow charts of FIGS. 4A, 4B and 4C only indicate how the control voltages for the tunable traps associated with the band of the selected channel are modified when scan activation switch 49 has been depressed, it will be appreciated that the control words for the tunable traps associated with the other band may also be modified when scan activation switch 49 has been depressed.

While the present invention has been described with reference to a multiplexing arrangement for tunable traps located between the VHF input and tuner, the arrangement may be expanded to include tunable traps located between the UHF input and tuner as is indicated in phantom in FIG. 1. However, since it has been found that interference signals do not affect the reception of UHF channels as much as they affect the reception of VHF channels, the latter addition may not be necessary. In the same respect, while the present invention has been described with reference to a multiplexing arrangement for pre-tuner tunable traps, a filter multiplexing arrangement constructed in accordance with the present invention may also be employed in connection with various tuned circuits used in the tuner itself and elsewhere in the receiver such as in the IF section.

It is further noted that since the control words stored in data memory 55 correspond to the desired frequencies for the VHF channels, the same control words may be utilized to derive the tuning voltages for these channels. Thus, the present multiplexing arrangement for tunable filters may be readily incorporated in a tuning system of the type in which tuning voltages are stored in digital form in a memory and converted by a D/A converter when corresponding channels are selected. A tuning system of this type is described in U.S. Pat. No. 4,123,713 entitled "Memory Type Tuning System with Provisions to Facilitate Setups" issued in the name of C. M. Wine on Oct. 31, 1976, and assigned like the present appliction to RCA Corporation, which patent is hereby incorporated by reference. This patent also describes how digital representations of tuning voltages may be generated and stored in a memory. The same arrangement may be employed to generate and store the control words in data memory 55.

In this connection it is further noted that while tuning systems of the type including a memory for storing digital tuning words typically include arrangements, often responsive to an automatic fine tuning (AFT) signal, to modify the tuning voltages in order to compensate for component and environmental changes, such provision are not thought to be necessary for a multiplexing arrangement for tunable filters. This is so because it has been found that tunable traps of the type shown in FIG. 1 provide enough attenuation of undesired signals even when the control voltages are not precise.

What is claimed is:

1. In a receiver including channel selection means for selecting one of a plurality of channels associated with respective RF carriers modulated with information, an input for receiving said RF signals, conversion means for producing an information bearing signal in accordance with the modulation of the RF carrier associated with the selected channel, and an output at which said information bearing signal is produced, apparatus comprising:

a plurality of frequency tunable circuits coupled between said input and said output and cooperating to control the frequency characteristics of said receiver between said input and output;

each of said frequency tunable circuits including a reactive element having a reactive value determined by the magnitude of a respective analog control signal; storage means coupled to said reactive means for storing said control signal; and a control input for receiving said respective control signal; each of said control inputs being substantially electrically isolated from the other ones of said control inputs;

digital to analog converter means for generating said control signals in response to the application of respective digital control words;

switch means for sequentially and individually applying said control signals generated by said digital to analog converter means to respective ones of said control inputs; and control means for sequentially supplying said digital control words to said digital to analog converter means to thus sequentially generate respective ones of said control signals and causing said switch means to synchronously and individually apply said sequentially generated control signals to respective ones of said control inputs while a single one of said channels is selected.

2. The apparatus recited in claim 1 wherein:

in each of said frequency tunable circuits said reactance element is a varactor diode, said control signal is a control voltage, said varactor diode being poled in said frequency tunable circuit to be reverse biased by said control voltage, and said storage means includes a capacitor coupled in parallel relationship to said varactor diode.

3. The apparatus recited in claim 1 wherein said receiver includes an RF input for receiving RF carriers and an RF tuner for selecting ones of said RF carriers in accordance with respective selected channels and heterodyning said selected RF carriers to produce an IF signal; and wherein at least one of said frequency tunable circuits includes a trap coupled between said RF input and said RF tuner for attenuating signals at frequencies which are offset from frequencies of respective selected RF carriers.

4. The apparatus recited in claim 3 wherein:
said plurality of frequency tunable circuits comprises first and second traps for attenuating signals at respective first and second frequencies which are at respective negative and positive offsets from frequencies of respective selected RF carriers.

5. The apparatus recited in claim 4 wherein:
said first and second frequencies are substantially equally offset from frequencies of respective selected RF carriers.

6. The apparatus recited in claim 5 wherein:
said selected RF carrier is in a first band; and
said plurality of frequency tunable circuits further comprises at least a third trap for attenuating a signal in a second band.

7. The apparatus recited in claim 1 wherein:
said control means includes memory means for storing digital data words related to said digital control words; and processor means for causing said data words to be read from said memory means.

8. The apparatus recited in claim 7 wherein:
said receiver includes RF input means for receiving a plurality of RF carriers; an RF tuner means for selecting RF carriers in response to tuning signals associated with respective selected channels and heterodyning selected RF carriers to produce an IF signal; and wherein:
said digital data words stored in said memory represent said tuning signals; and
said processor means modifies said digital data words to derive said digital control words.

9. The apparatus recited in claim 8 wherein:
said plurality of frequency tunable circuits includes a trap for attenuating signals at frequencies which are offset from the frequencies of selected RF carriers; and
said processor means additively combines a digital data word representing the amount of said offset and said digital data word representing said tuning signals corresponding to respective selected RF carriers to derive said digital control words.

10. The apparatus recited in claim 9 wherein:
said control means includes scan activation means for selectively generating a scan activation signal;
said processor means selectively modifies said digital data word representing the amount of said offset in response to said scan activation signal.

11. The apparatus recited in claim 10 wherein:
said processor means sequentially changes said digital data word by a digital data word representing a predetermined increment.

12. In a receiver including channel selection means for selecting one of a plurality of channels associated with respective RF carriers modulated with information, an input for receiving said RF signals, conversion means for producing an information bearing signal in accordance with the modulation of the RF carrier associated with the selected channel, and an output at which said information bearing signal is produced, apparatus comprising:

at least two frequency tunable circuits coupled between said input and said output and cooperating to control the frequency characteristics of said receiver between said input and output;

each of said frequency tunable circuits including a reactive element having a reactive value determined by the magnitude of a respective analog control signal which is independent of the magnitude of the other one of said control signals; storage means coupled to said reactive means for storing said control signal; and a control input for receiving said respective control signal;

digital to analog converter means for generating said control signals in response to the application of respective digital control words;

switch means for sequentially and individually applying said control signals generated by said digital to analog converter means to respective ones of said control inputs; and control means for sequentially supplying said digital control words to said digital to analog converter means to thus sequentially generate respective ones of said control signals and causing said switch means to synchronously and individually apply said sequentially generated control signals to respective ones of said control inputs while a single one of said channels is selected.

13. In a receiver including channel selection means for selecting one of a plurality of channels associated with respective RF carriers modulated with information, an input for receiving said RF signals, conversion means for producing an information bearing signal in accordance with the modulation of the RF carrier associated with the selected channel, and an output at which said information bearing signal is produced, apparatus comprising:

a plurality of frequency tunable circuits coupled between said input and said output and cooperating to control the frequency characteristics of said receiver between said input and output;

each of said frequency tunable circuits including a reactive element having a reactive value determined by the magnitude of a respective analog control signal; storage means coupled to said reactive means for storing said control signal; and a control input for receiving said respective control signal;

a memory including a plurality of memory locations each uniquely corresponding to a respective one of said frequency tunable circuits, each storing a digital control word for controlling said respective one of said frequency tunable circuits and each having a unique respective address;

digital to analog converter means for generating said control signals in response to the application of respective ones of said digital control words from said memory;

switch means for sequentially and individually applying said control signals generated by said digital to analog converter means to respective ones of said control inputs; and control means for sequentially addressing said memory locations whereby said digital control words are sequentially and individually supplied to said digital to analog converter means to thus sequentially and individually generate respective ones of said control signals and causing said switch means to synchronously and individually apply said sequentially generated control signals to respective ones of said control inputs while a single one of said channels is selected.

14. The apparatus recited in claim 13 wherein:
said control means includes means for changing said digital control words stored in at least one of said memory locations.

* * * * *

UNITED STATES PATENT AND TRADEMARK OFFICE
CERTIFICATE OF CORRECTION

PATENT NO. : 4,368,541

DATED : January 11, 1983

INVENTOR(S) : ROBERT MICHAEL EVANS

It is certified that error appears in the above-identified patent and that said Letters Patent is hereby corrected as shown below:

On the title page add:

-- [73] Assignee: RCA Corporation, New York, N.Y. --.

Signed and Sealed this

Thirty-first Day of January 1984

[SEAL]

Attest:

GERALD J. MOSSINGHOFF

Attesting Officer

Commissioner of Patents and Trademarks